United States Patent [19]
DuFort

[11] Patent Number: 5,101,211
[45] Date of Patent: Mar. 31, 1992

[54] CLOSED LOOP RF POWER AMPLIFIER OUTPUT CORRECTION CIRCUIT

[75] Inventor: Edward C. DuFort, Fullerton, Calif.

[73] Assignee: Hughes Aircraft Company, Los Angeles, Calif.

[21] Appl. No.: 639,603

[22] Filed: Jan. 10, 1991

[51] Int. Cl.$^5$ .................. G01S 7/40; H01Q 3/36; H03F 1/32; H03F 3/24

[52] U.S. Cl. .................. 342/174; 342/368; 330/107; 330/295

[58] Field of Search .................. 342/174, 175, 368; 330/107, 295, 86, 124 R

[56] References Cited

U.S. PATENT DOCUMENTS

| | | | |
|---|---|---|---|
| 3,735,288 | 5/1973 | Strauss | 330/107 X |
| 4,600,892 | 7/1986 | Wagner et al. | 342/174 X |
| 4,794,343 | 12/1988 | Yang | 330/245 X |
| 4,985,686 | 1/1991 | Davidson et al. | 330/124 R |
| 5,008,844 | 4/1991 | Kyriakos et al. | 342/174 |

OTHER PUBLICATIONS

Vaccaro et al., "Product Design of a High-Power S-Band MIC Module for Phased Arrays", IEEE Trans Microwave Theory and Techniques, MTT-19, No. 7, pp. 604–616, Jul. 71.

Hoft et al., "Solid State Transmitters", Electronic Progress, vol. 17, No. 2, pp. 25–33, Summer 75, Raytheon Company.

Primary Examiner—Gilberto Barrón, Jr.
Attorney, Agent, or Firm—W. K. Denson-Low

[57] ABSTRACT

A closed loop RF power amplifier output correction circuit is disclosed, for providing closed loop continuous amplitude and phase correction of solid state amplifiers. The circuit includes a two channel RF solid state high power amplifier whose inputs are fed through two control phase shifters and whose outputs are combined in a hybrid junction. A reference signal is provided, which the power amplifier must duplicate in amplitude and phase. A coupling and comparision circuit compares the reference signal and the amplifier output signal and provides an error signal representative of error power. Digital circuitry is provided which takes only relative error power measurements and nulls the error by adjusting the control phase shifters in a closed loop.

17 Claims, 5 Drawing Sheets

CLOSED LOOP RF POWER AMPLIFIER OUTPUT CORRECTION CIRCUIT

BACKGROUND OF THE INVENTION

The present invention relates to RF power amplifiers, and more particularly to an output correction circuit which provides closed loop continuous amplitude and phase correction of solid state amplifiers.

An example of this application is for a solid state phased array requiring thousands of very accurate (say ±5° phase ±½ dB amplitude) power amplifiers in order to produce very low sidelobe transmit patterns.

Most conventional solid state phased arrays have been concerned with power output, cost, and efficiency. The poor output accuracy of solid state phased arrays, i.e., the amplitude and phase errors relative to an ideal distribution, was accepted as the nature of the solid state approach. The present invention is particularly suitable for the class C amplifiers normally employed below S band. For these amplifiers, changing drive level may be a very difficult way to adjust the output because the input/output relation is non-linear and very sensitive. Also the amplitude and phase are not independent. One known method for controlling linear class A amplifiers is described in "Adaptive Module Techniques," A.W. Morse and G.S. Hill, Final Report to RADC, Griffiss Air Force Base, RADC-TR-83-98, June 1983. The drive level is changed in this approach. Separate measurements of amplitude and phase are made, a relatively complex procedure. Also the method is not closed loop; consequently, accurate phase and amplitude measurements are necessary. These measurements usually involve the use of accurately matched or accurately calibrated active devices (detectors, amplifiers, or the like).

SUMMARY OF THE INVENTION

In accordance with the invention, a closed loop RF power amplifier output correction circuit is disclosed, for providing closed loop continuous amplitude and phase correction of solid state amplifiers. The circuit includes a two channel RF solid state high power amplifier whose inputs are fed through two control phase shifters, and whose outputs are combined in a hybrid junction, typically a magic tee. A reference signal is provided, which the power amplifier must duplicate in amplitude and phase. A coupling and comparison circuit is responsive to a coupled portion of the output from the power amplifier and to the reference signal, and develops an error power signal therefrom. Digital circuitry is provided which takes only relative error power measurements and nulls the error by adjusting the control phase shifters in a closed loop.

In a preferred implementation, the coupling and comparison circuit includes a magic tee which combines the reference signal and the coupled portion of the amplifier output signal, and a power sensitive device such as a bolometer which is responsive to the magic tee output to develop the error signal. The digital circuitry includes an analog-to-digital converter to digitize the error signal, and means for processing the digitized error signals to generate phase shifter control signals to null the error.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
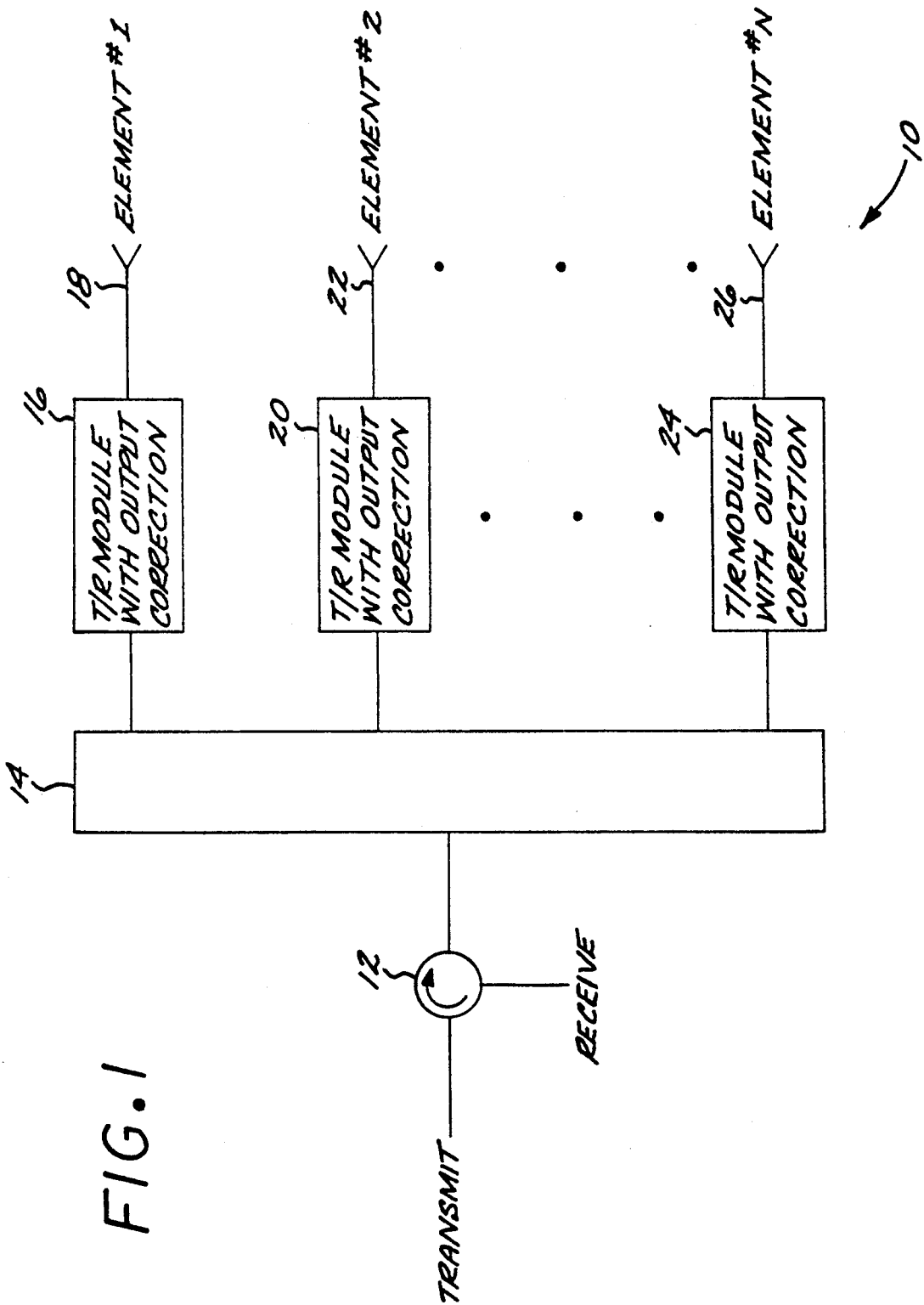
FIG. 1 is a simplified block diagram of a radar system employing the subject invention.

The preferred embodiment of the invention is employed in a phased array active radar system, as generally indicated in the simplified block diagram of FIG. 1. The radar system 10 includes a transmit drive source (not shown) for providing the transmit drive signal to circulator 12 and to the corporate feed network 14. In a typical system, the feed network 14 will divide the transmit drive signal into N corporate feed network outputs, each for driving a respective transmit/receive module, here exemplary modules 16, 20 and 24. As is well known, the feed network 14 is typically carefully tailored and controlled to provide a particular amplitude and phase distribution across its outputs to achieve a desired sidelobe pattern, e.g., an amplitude tapered distribution. Each module 16, 20 and 24 comprises output correction circuitry in accordance with the invention, as described in further detail below. In this example, the feed network 14 is also used on receive, with the receive signal being taken from circulator 12, so that the same sidelobe pattern will be employed on receive as on transmit. Of course, as is well known to those skilled in the art, radar systems employing separate feed networks for transmit and receive may also be suitable for particular applications, permitting the receive function to have a different sidelobe pattern from the transmit function. The particular type of feed network is not per se a part of the invention.

The purpose of the invention is to achieve correction of the outputs from the respective modules 16, 20 and 24 so that an amplitude and phase distribution across the outputs of the modules proportional to that of the feed network outputs is achieved, thereby correcting for any phase and amplitude errors introduced by the modules themselves.

Figure 2:
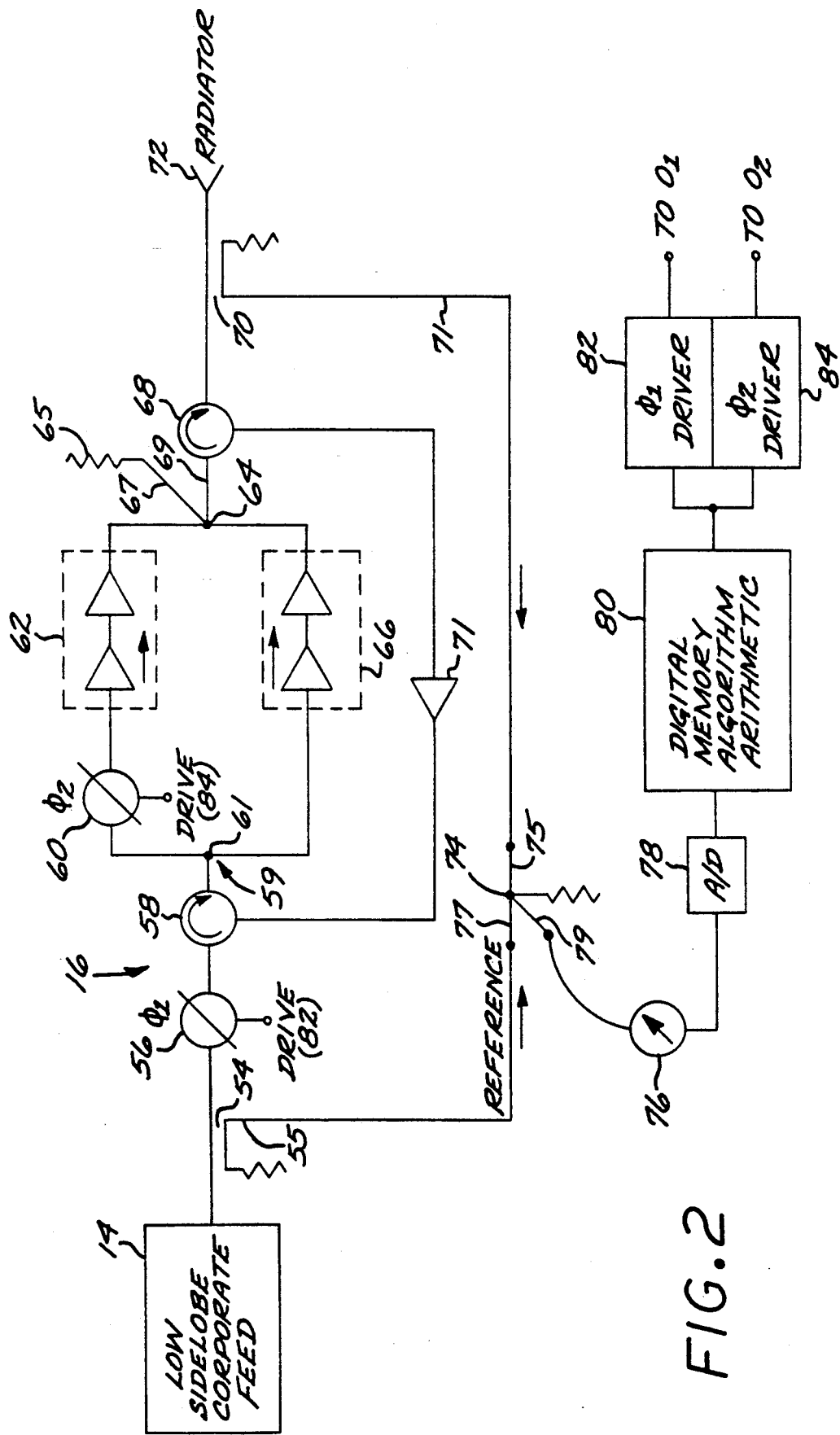
FIG. 2 is a simplified block diagram of a solid state RF transmit/receive power module employing output correction of the transmit signal in accordance within the invention.

A schematic block diagram of an exemplary transmit/receive module 16 comprising the array system of FIG. 1 is shown in FIG. 2. The transmit drive signal provided by the corporate feed network 14 enters the module 16 via a power coupler 54 which couples off a small portion of the power of the drive signal for use as the reference signal for the correction circuit, as described more fully below. The primary output of the coupler 54 is then passed through variable phase shifter 56 and circulator 58 to the module 59, where it is divided into two equal signals by a power divider 61 to be respectively supplied to the variable phase shifter 60 in one channel and directly to amplifier 66 in the other channel.

The high power amplifier (HPA) is shown as a two-channel module 59 whose amplitudes and phases are nominally correct, i.e., identical, and add to the desired value through the side arms of the magic tee 64. Differences (or errors) between the two channels 62 and 66 are dissipated in a load 65 terminating the difference arm 67 of the magic tee coupler 64.

The receive side of the T/R module 16 also is shown in FIG. 2 and comprises circulators 58 and 68 and low noise amplifier 71. The circulators 58 and 68 isolate the transmit and receive channels to allow the receive signal to pass into the corporate feed network 14 when receiving.

The phase shifters 56 and 60 are adjusted to provide the correct amplitude and phase of the HPA 59 output. Due to the isolation and impedance match properties of a magic tee coupler, the channels 62 and 66 of the HPA are isolated. Adjustments to the phase shifters 56 and 60 change only the phase of each channel which does not perturb the operation of the amplifiers; however, both the amplitude and phase of the combined output at the magic tee sum arm 69 may be changed. The phase shifter 56 adjusts the output phase only, and the phase shifter 60 adjusts the amplitude (and incidentally the phase).

A directional coupler 70 at the HPA output taps off a small portion of the transmit signal and feeds it to the side arm 75 of a second, error detecting, magic tee 74. Hybrid junction 54 is attached to the output of the corporate feed network 14 which drives the module 16. A second port 55 of hybrid 54 provides the reference signal and is connected to the other side arm 77 of the error detecting magic tee 74.

The electrical lengths of transmission lines 55 and 71 to the respective ports of the magic tee device 74 are equal. Moreover, the coupling ratios of the respective couplers 54 and 70 are selected so that the power of the reference signal is equal to the power of the coupled portion of the output signal from the coupler 70 when the system is perfectly compensated. Thus, for example, if the module provides 20 dB gain of the input drive signal, then the coupling ratio of the output coupler 70 will be selected to be 20 dB less than that of the input coupler 54.

The coupled HPA output from coupler 70 is subtracted from the reference signal by the magic tee 74 and the error power produces a response in the power sensitive error device or sensor 76 attached to the difference arm 79 of the magic tee 74. The power sensor 76 produces a null when the two signals (the coupled HPA output and the reference signal) are the same (equal amplitude and equal phase). There is an error power when the reference and coupled output signals are different, either in amplitude or phase. The error signal obeys a known functional relationship to the two signals. Typically, the error signal is proportional to the squared magnitude of the difference between the reference signal and the coupled HPA output signal. This relationship forms the basis of an algorithm for nulling the error. This error signal response is passed through an analog-to-digital (A/D) converter 78 into a digital unit 80 which contains memory, executes an adaptation algorithm, and outputs signals which direct phase shifter drivers 82 and 84 to adjust the phase shifters until the error power is nulled.

The output correction circuit in accordance with the invention adds the following equipment to a basic TR module in a phased array:

1. A second phase shifter (one usually is already in place) in the input circuit to the HPA.
2. A coupler at the output of the HPA.
3. A hybrid junction which passes the reference signal on transmit or the receive signal in receive.
4. A comparator magic tee and power sensitive device.
5. Analog-to-digital converter.
6. Digital equipment for operating on the error power and determining revised estimated phase shifter settings.
7. A second phase shifter driver (one usually is already in place) for setting phase.

The output correction system is closed loop; changes are based on the error power which is nulled only when the coupled output power equals the reference. No absolute measurements are required and the power sensitive device 76 need not be accurate or accurately calibrated since this is a null seeking system. The power sensitive device may comprise, for example, a bolometer.

Figure 3:
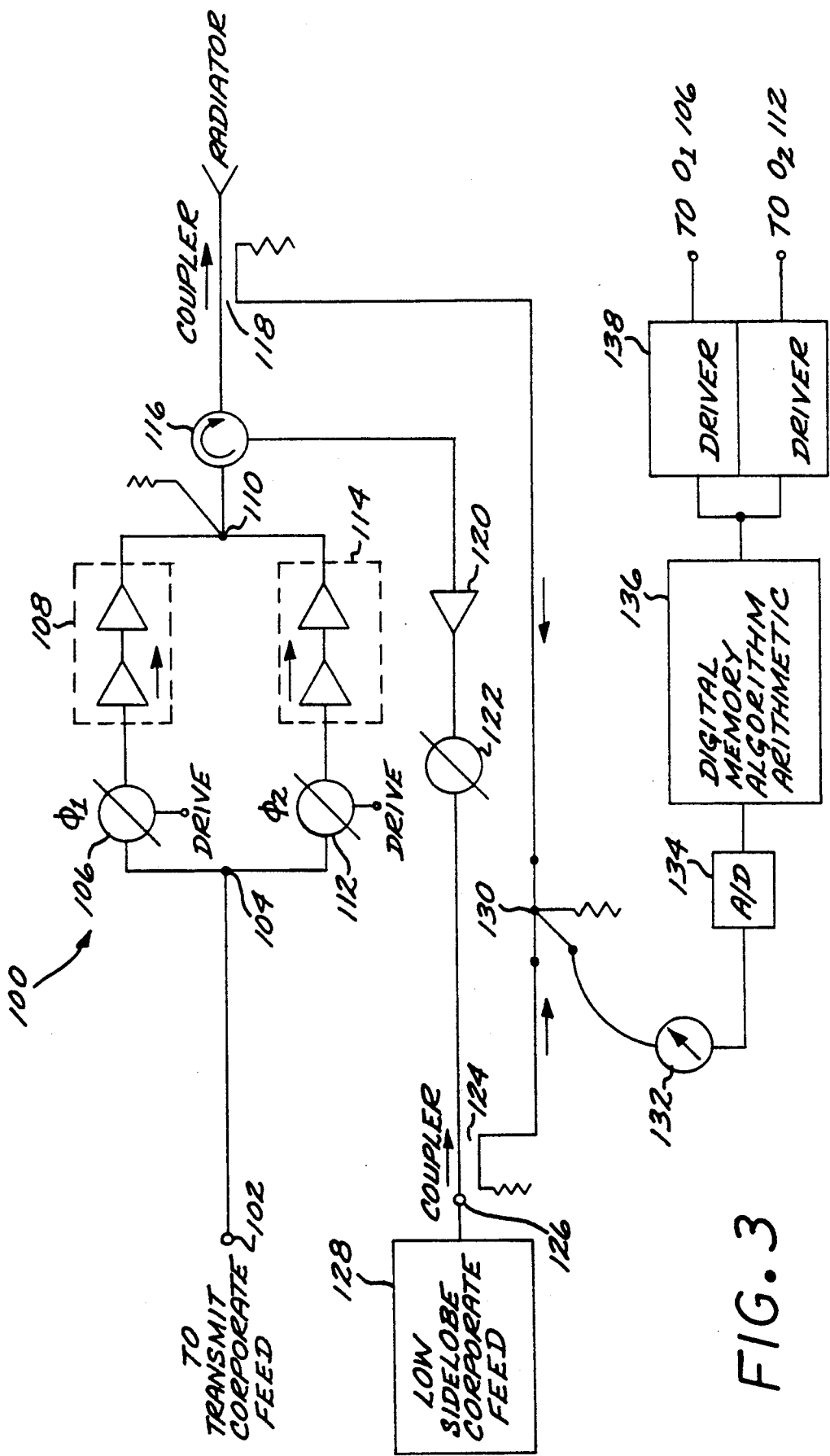
FIG. 3 is a simplified block diagram of an alternative embodiment of a solid state transmit/receive module employing output correction in accordance with the invention.

An alternate embodiment of the invention is in symmetrical form as shown in the solid state module 100 of FIG. 3. One transmit control phase shifter 106 and 112 is placed in each channel of the HPA to control both amplitude and phase of the combined signal. This alternative requires one more phase shifter; however, it may be easier to reduce to hardware. Also, the operation of the invention is easier to describe since each phase shifter 106 and 112 effects only the phase of the channel in which it resides. Let the HPA 108 in channel one produce a signal $A_1 \exp(j\theta_1)$ and let its phase shifter 106 be set at $\phi_1$ for a total phase shift $t_1 = \theta_1 + \phi_1$. Similarly, let the HPA 114 in channel two produce a signal $A_2 \exp(j\theta_2)$ and let its phase shifter 112 be set at $\phi_2$ for a total phase shift $t_2 = \theta_2 + \phi_2$. The output Z of the combining tee 116 is determined by eq. 1a.

$$Z = (Z_1 + Z_2)/\sqrt{2} \qquad (1a)$$

where $$Z_1 = A_1 e^{jt_1} \text{ and} \qquad (1b)$$

$$Z_2 = A_2 e^{jt_2} \qquad (1c)$$

For error free operation $A_1 = A_2 = A$ and $\theta_1 = \phi_1 = 0 = t_1$ and similarly in channel two. This would produce the correct output which would equal the reference signal $R = \sqrt{2} A$. The output power P of the comparator tee 130 generally is:

$$P = |Z - R|^2/2 = (A_1 \sin t_1 + A_2 \sin t_2)^2/4 + (A_1 \cos t_1 + A_2 \cos t_2 - 2A)^2/4 \qquad (2)$$

Figure 4A:
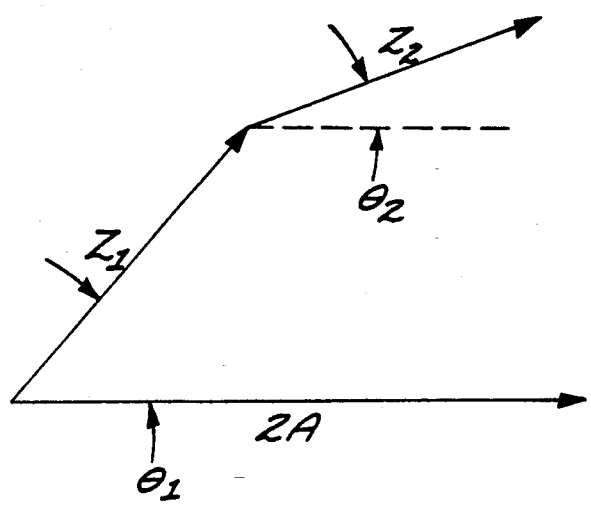
FIGS. 4A and 4B are vector diagrams illustrative of the correction process in accordance with the invention.
Figure 4B:
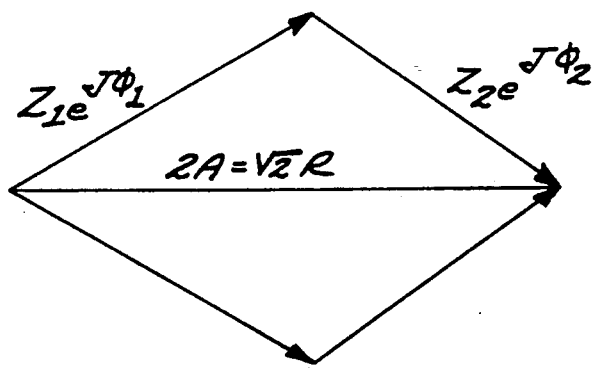
Figure 5:
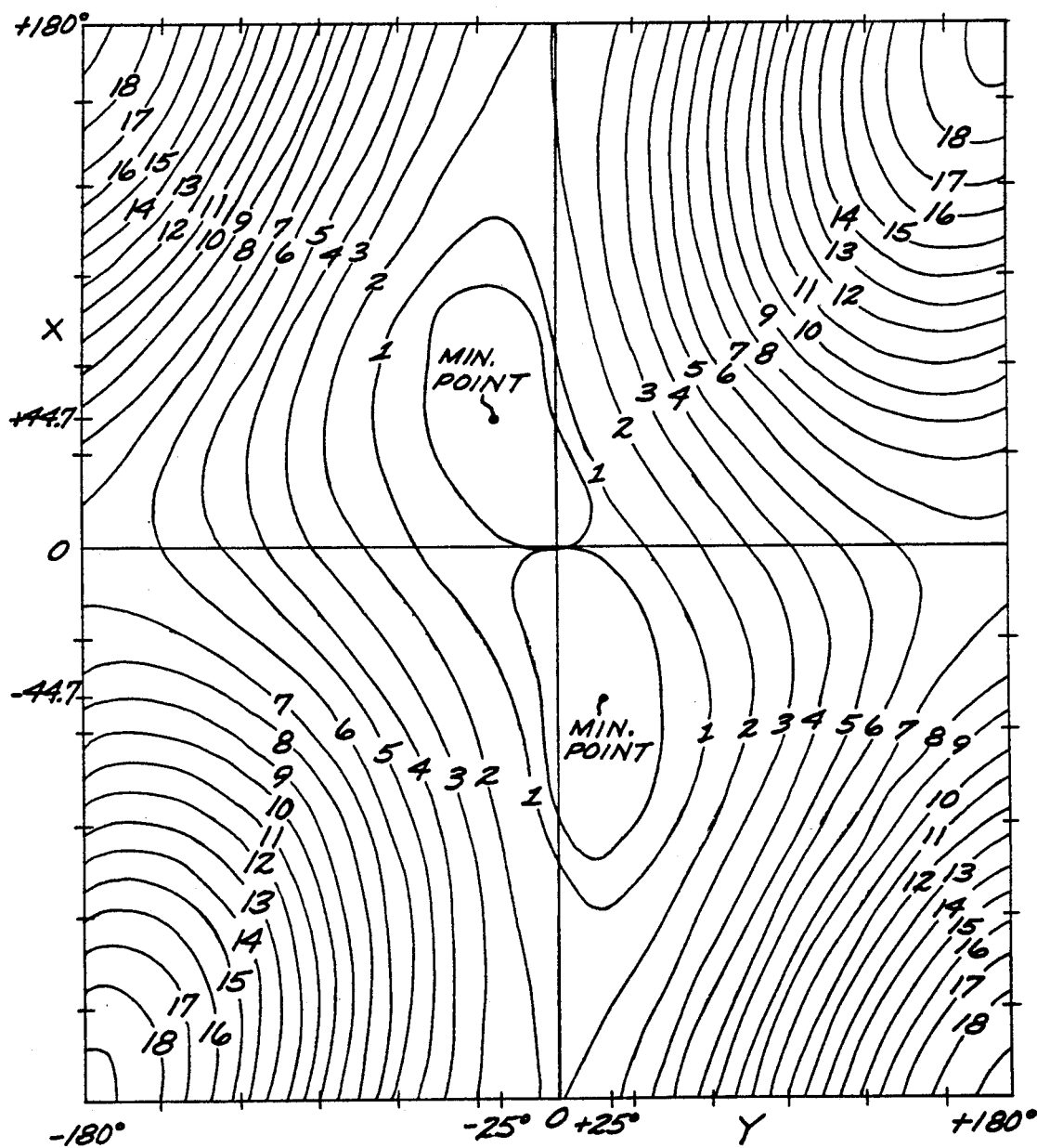
FIG. 5 is a power contour plot illustrative of one aspect of the invention.

Typical vectors $Z_1$, $Z_2$ and R are shown in FIG. 4A and 4B. The geometry of these figures reveals that as long as $(A_1 + A_2) > \sqrt{2} R$, the vectors $Z_1$ and $Z_2$ may be rotated by means of $\phi_1$ and $\phi_2$ such that the error power vanishes for two pairs of phase shift settings. It is apparent that a maximum will occur when both channels are 180° out-of-phase with the reference. Generally there is a saddle point between the minima. Of course, the power outputs of the two channels must be large enough relative to the reference signal power, or else the correction circuit will be unable to null the error power and thus fully correct the two channels (as in the example of eq. 2). Moreover, the greater the differences between the outputs of the two channels, the more error power will be produced and dissipated in the load 67, and the less efficient will be the module operation. In many applications, however, reduction in sidelobes resulting from this invention is more important a consideration than the efficiency.

A power contour plot determined from eq. 2 is shown in FIG. 4 for the exemplary case of two channels with zero phase error, but where one channel has an amplitude of 1.5 and the other 0.9 instead of the desired values of unity each. The two error power zeros at ±25° and ±44.7° are apparent in the figure. The maximum occurs when both phase shifters are at ±180°. From the example of FIG. 4, it is apparent that one of the nulls can always be found without knowing the shape or value of the power contours. This can be accomplished, for example, by wandering around the contour surface, noting relative power levels and always moving to a lower error level. Many algorithms for systematically searching a surface for a minimum already exist. Exemplary algorithms well known in the art for performing this function include:

1. rectilinear search.
2. random search.
3. estimated gradient search.
4. accelerated estimated gradient search.

If the power surface is visualized as a smooth topographic terrain map, then a marble placed anywhere on the surface will roll along the local gradient into one of the nulls. The gradient search algorithms attempt this rapidly converging approach. The exact gradient, the path of steepest descent, involves partial derivatives which are unknown. Instead three of the past power measurements may be used to fit a local plane to the data from which a gradient may be estimated. Moderately sized phase steps are taken along this estimated gradient until the power at the last setting increases instead of decreases. An interpolated minimum is found from the last three power readings. The process is then repeated, starting from the interpolated minimum. It is necessary to reduce the step size as the time minimum is approached. No data are gathered solely for the gradient estimate then discarded - rather all recent measurements are used. A search simulation corresponding to the situation depicted in FIG. 4 is shown in Table I below where the notation C, X, Y, P stands for iteration number (C), first phase shifter value in degrees (X), second phase shifter value (Y), error power in arbitrary units (P). The starting point is the C=0 row, X=90°, and Y=90°. Note that there is a 10-dB improvement in error power and convergence to near the correct answer (±44.7°, ±25°) with only two iterations. Other starting positions may produce a slower or faster convergence; however, the system is stable and one of the correct solutions is always found.

TABLE I

| C | X | Y | P |
|---|---|---|---|
| CXYP = 0 | 90 | 90 | 9.76 |
| CXYP = 1 | 69.6075429704 | 49.8858167686 | 4.48133224635 |
| CXYP = 2 | 37.6173289582 | 18.2373380134 | 1.05682610353 |
| CXYP = 3 | 50.5404174154 | −24.8671140157 | 8.60917195236E-03 |
| CXYP = 4 | 45.5636838487 | −24.1730566446 | 8.07746284132E-04 |
| CXYP = 5 | 45.4143094779 | −24.919720763 | 1.42264428626E-04 |
| CXYP = 6 | 45.0540810597 | −25.1846992428 | 4.78714848853E-05 |
| CXYP = 7 | 44.9775909974 | −25.0216692746 | 1.99927097655E-05 |
| CXYP = 8 | 44.6868777141 | −24.9856417374 | 7.24899935957E-07 |
| CXYP = 9 | 44.6783397202 | −24.9535796304 | 4.55817141436E-09 |
| CXYP = 10 | 44.6756949002 | −24.9533789522 | 2.60411793563E-09 |

The present invention is applicable to all solid state amplifiers, particularly those used in modular arrays. Particular advantages of the system include (1) the amplifiers remain isolated, and therefore may be tuned for optimum efficiency, (2) error corrections produce no change in device efficiency or operating conditions of each channel (except for phase), (3) no absolute measurements are made to produce the correction, (4) no accurate measurements or accurate hardware is required (except that which produces the reference signal) because the system is closed loop, (5) the additional equipment is mostly inexpensive digital modules, (6) the reference signal equipment, which must be precise, may already be in place for other reasons.

Once the null has been found for a particular frequency, the setting can be stored and reused when the particular frequency is used again by the radar. Thus, for particular applications, the system need update corrections only periodically (e.g., every few seconds and not for every pulse).

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A closed loop RF power amplifier output correction circuit, characterized by:
    a two channel RF solid state high power amplifier whose inputs are fed through first and second control phase shifters and whose channel outputs are combined in a hybrid junction to form an amplifier output;
    a reference signal which the amplifier output must duplicate in relative amplitude and phase;
    a coupling and comparison circuit responsive to said reference signal and said amplifier output signal for developing an error power signal; and
    circuitry responsive to said error power signal which nulls said error power signal by adjusting the control phase shifters in a closed loop.

2. The circuit of claim 1 wherein said coupling and comparison circuit comprises a bolometer for developing said error signal representative of error power, and said circuitry is responsive to said error signal for taking relative error power measurements.

3. The circuit of claim 1 wherein said hybrid junction comprises a magic tee device.

4. The circuit of claim 1 wherein said digital circuitry comprises analog-to-digital converter means for converting said error power signal to digital form, and processing means for processing said digitized error signals to provide phase shifter adjusting signals.

5. The circuit of claim 1 further characterized in that said circuit is employed in an active radar system and is responsive to a transmit drive signal, and said reference signal is taken from said transmit drive signal.

6. The circuit of claim 1 wherein said coupling and comparison circuit comprises a coupler for tapping off a small portion of the combined output of said hybrid junction, and a magic tee hybrid coupler for taking the difference of said small portion of said combined output of said hybrid junction and said reference signal.

7. The circuit of claim 6 wherein said coupling and comparison circuit further comprises a power sensitive error device responsive to the signal at the difference port of said magic tee hybrid coupler.

8. The circuit of claim 1 wherein said inputs to said two channel RF amplifier are nominally equal and in-phase.

9. The circuit of claim 1 wherein said power amplifier is driven by a drive signal, and said correction circuit further comprises power divider means for dividing said drive signal into first and second equal channel input signals, and wherein said first phase shifter shifts the phase of said drive signal and said second phase shifter shifts the phase of said first input signal.

10. The circuit of claim 1 wherein said first and second phase shifters are respectively disposed in said first and second channels to respectively shift the phase of the inputs to said first and second channels.

11. An active radar system comprising:
a plurality of radiating elements;
means for providing a transmit drive signal;
means for dividing said drive signal into a plurality of radiating element drive signals;
a plurality of active solid state modules each responsive to a corresponding one of said radiating element drive signals, each said module comprising:
coupler means for coupling off a small portion of said radiating element drive signal to serve as a reference signal which a replica of the module output signal must duplicate in relative amplitude and phase;
means for dividing said radiating element drive signal into two equal module drive signals;
a two channel RF solid state high power amplifier whose inputs are fed through first and second control phase shifters and whose channel outputs are combined in a hybrid junction to form an amplifier output;
a coupling and comparison circuit responsive to said reference signal and said amplifier output signal for developing an error power signal;
means responsive to said error power signal for nulling said error power signal by adjusting said control phase shifters in a closed loop.

12. The circuit of claim 11 wherein said coupling and comparison circuit comprises a bolometer for developing said error signal representative of error power, and said nulling means is responsive to said error signal for taking said relative error power measurements.

13. The circuit of claim 11 wherein said hybrid junction comprises a magic tee device.

14. The circuit of claim 11 wherein said nulling means comprises analog-to-digital converter means for converting said error signal to digital form, and processing means for processing said digitized error signals to provide phase shifter adjusting signals.

15. The circuit of claim 11 wherein said coupling and comparison circuit comprises a coupler for tapping off a small portion of the combined output of said hybrid junction, and a magic tee hybrid coupler of taking the difference of said small portion of said combined output of said hybrid junction and said reference signal.

16. The circuit of claim 11 wherein said first and second phase shifters are respectively disposed in said first and second channels.

17. The radar system of claim 11 wherein said first phase shifter is disposed to shift the phase of said radiating element drive signal prior to said dividing means, and said second phase shifter means is disposed in said first channel.

* * * * *